United States Patent
Lee et al.

(10) Patent No.: US 7,407,000 B2
(45) Date of Patent: Aug. 5, 2008

(54) LIQUID COOLING DEVICE

(75) Inventors: Hsieh-Kun Lee, Tu-Cheng (TW);
Cheng-Tien Lai, Tu-Cheng (TW);
Zhi-Yong Zhou, Shenzhen (CN);
Jiang-Jian Wen, Shenzhen (CN)

(73) Assignees: Fu Zhun Precision Industry (Shenzhen) Co., Ltd., Bao'an District, Shenzhen, Guangdong Province (CN);
Foxconn Technology Co., Ltd., Tu-Cheng, Taipei Hsien (TW)

( * ) Notice: Subject to any disclaimer, the term of this patent is extended or adjusted under 35 U.S.C. 154(b) by 382 days.

(21) Appl. No.: 11/204,688

(22) Filed: Aug. 15, 2005

(65) Prior Publication Data
US 2006/0137863 A1 Jun. 29, 2006

(30) Foreign Application Priority Data
Dec. 24, 2004 (CN) .................. 2004 1 0918575

(51) Int. Cl.
*F28D 15/00* (2006.01)
*F28F 7/02* (2006.01)

(52) U.S. Cl. .................. 165/104.33; 165/80.3

(58) Field of Classification Search ........ 165/80.2–80.5, 165/104.19, 104.28, 104.31, 104.33; 361/699, 361/697, 701–703
See application file for complete search history.

(56) References Cited

U.S. PATENT DOCUMENTS

| 3,989,102 | A | 11/1976 | Jaster et al. |
| 3,996,314 | A | 12/1976 | Lakmaker |
| 6,019,165 | A * | 2/2000 | Batchelder .................. 165/80.3 |
| 6,029,742 | A * | 2/2000 | Burward-Hoy ............ 165/80.4 |
| 6,600,649 | B1 * | 7/2003 | Tsai et al. .................... 361/697 |
| 6,639,797 | B2 | 10/2003 | Saeki et al. |
| 6,697,253 | B2 | 2/2004 | Minamitani et al. |
| 7,222,661 | B2 * | 5/2007 | Wei et al. .................... 165/80.4 |
| 2003/0201092 | A1 * | 10/2003 | Gwin et al. ................. 165/80.4 |
| 2003/0209343 | A1 * | 11/2003 | Bingler ....................... 165/80.4 |
| 2004/0221604 | A1 * | 11/2004 | Ota et al. .................... 62/259.2 |
| 2005/0168939 | A1 * | 8/2005 | Iijima et al. ............ 165/104.33 |
| 2005/0178528 | A1 * | 8/2005 | Ohashi et al. .............. 165/80.3 |

FOREIGN PATENT DOCUMENTS

| TW | 545870 | 8/2003 |
| TW | M246988 | 10/2004 |
| TW | M246989 | 10/2004 |

* cited by examiner

Primary Examiner—Teresa J Walberg
(74) *Attorney, Agent, or Firm*—Morris Manning Martin LLP; Tim Tingkang Xia, Esq.

(57) ABSTRACT

A liquid cooling device includes a heat-dissipating unit (1) and a heat-absorbing unit (2). The heat-dissipating unit (1) connects with the heat-absorbing unit (2) by an inlet pipe (4) and an outlet pipe (3) to form a closed circulation loop. The heat-dissipating unit (1) includes a base (10), a tank (20), a heat-dissipating body (30) beside the tank (20) and a cover (40), which are assembled together as a single unit. A pump (23) is placed in the tank (20) and operated to pump liquid coolant to flow in the circulation loop. During flowing through the base (10) and the cover (40), the liquid coolant transfers heat to the heat-dissipating body (30).

14 Claims, 4 Drawing Sheets

LIQUID COOLING DEVICE

BACKGROUND

1. Field

The present invention relates to a cooling device, and more particularly to a cooling device utilizing liquid for cooling a heat-generating electronic device.

2. Related Art

Liquid cooling devices were commonly utilized to cool huge heat-generating systems such as furnaces. Today, liquid cooling devices are also used to cool electronic components, such as chipsets, power chips or computer central processing units (CPUs), by circulating the liquid coolant in a channel to take heat away from the electronic components.

Usually, a conventional liquid cooling device is made of a series of units deposited dispersedly. The liquid cooling device includes a plurality of cooling bodies, a heat absorbing body defining a chamber therein for containing liquid coolant and cooling pipes connecting with the cooling bodies and the heat absorbing body. The heat absorbing body used to absorb heat from an electronic component to be cooled is communicated with the cooling bodies via the cooling pipes to form a closed circulation loop for the liquid coolant. Due to a long distance between the cooling bodies and the cooling pipes, space occupied by the liquid cooling device is large. It is in contradiction with the trend that electronic equipments become smaller and smaller today.

SUMMARY

What is needed is a liquid cooling device which has a compact structure and an excellent liquid cooling efficiency.

A liquid cooling device in accordance with a preferred embodiment of the present invention comprises a heat-dissipating unit, a heat-absorbing unit defining a chamber therein for containing liquid coolant, an inlet pipe and an outlet pipe. The heat-dissipating unit connects with the heat-absorbing unit by the inlet pipe and the outlet pipe. The heat-dissipating unit comprises a base, a tank with a pump therein deposited on the base, a heat dissipating body beside the tank and a cover attached to the heat dissipating body and the tank. The heat-absorbing unit, the base, the tank and the cover cooperatively together form a closed loop for circulation of the liquid coolant in the liquid cooling device. The pump drives the liquid coolant to flow from the heat-absorbing unit into the base via the liquid inlet pipe, leave the base into the cover through the tank, and finally leave the cover to the liquid outlet pipe through the tank and back to the heat-absorbing unit via the liquid outlet pipe.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
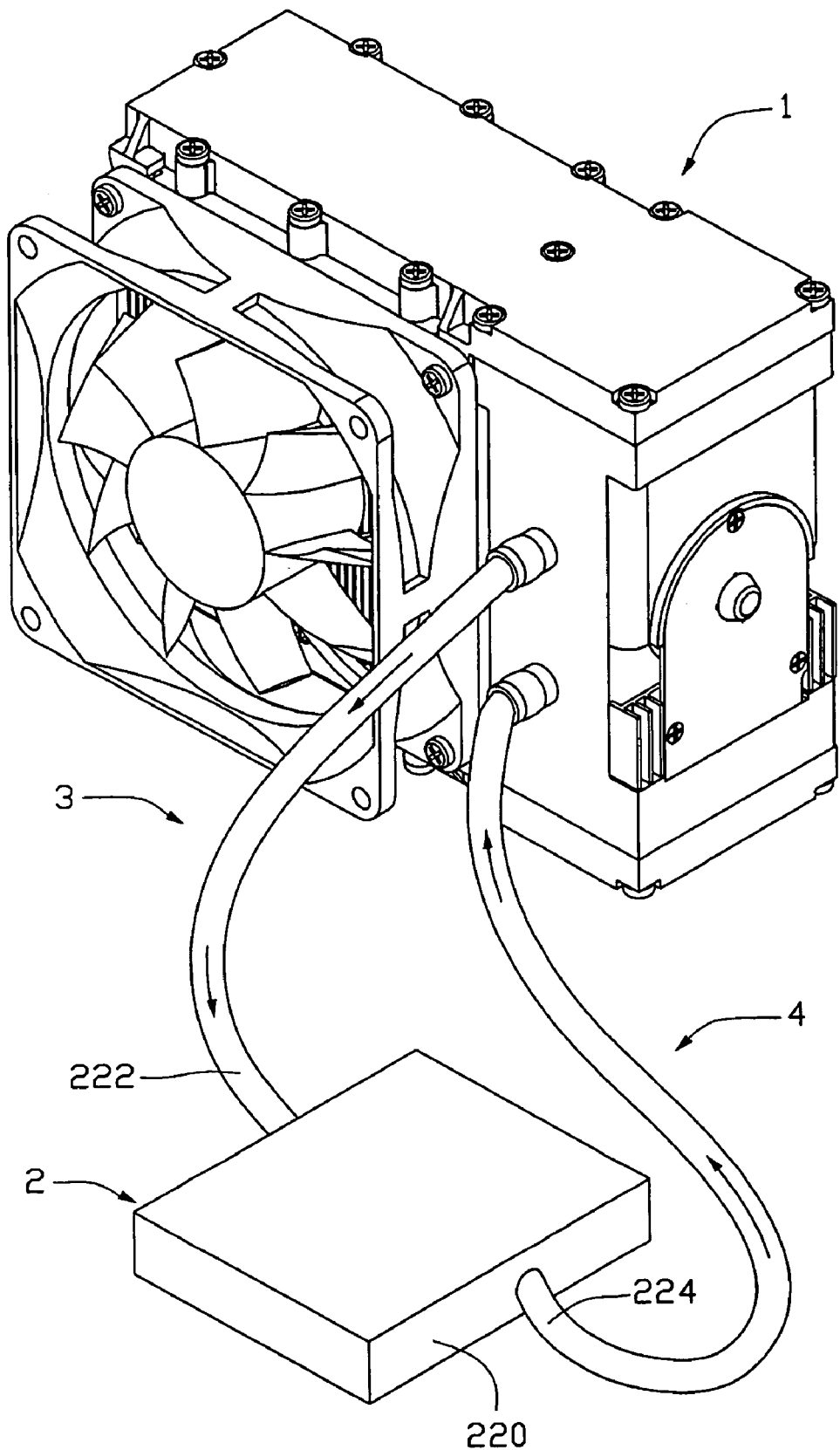
FIG. 1 is an assembled view of a liquid cooling device in accordance with a preferred embodiment of the present invention.

FIG. 1 illustrates a liquid cooling device in accordance with a preferred embodiment of the present invention. The liquid cooling device comprises a heat-dissipating unit 1, a heat-absorbing unit 2 for thermally contacting with a heat generating electronic component (not shown), such as a CPU, a liquid outlet pipe 3 and a liquid inlet pipe 4. The heat-dissipating unit 1 connects with the heat-absorbing unit 2 by the liquid outlet pipe 3 and the liquid inlet pipe 4. The heat-absorbing unit 2 defines a chamber 220 filled with liquid coolant, a liquid inlet 222 connecting with the liquid outlet pipe 3 and a liquid outlet 224 connecting with the liquid inlet pipe 4. The liquid coolant absorbs heat from the heat-generating electronic component and is pumped to flow into the heat-dissipating unit 1 for heat dissipating and then returns to the heat-absorbing unit 2 from the heat-dissipating unit 1 to complete a liquid circulation as shown by arrows.

Figure 2:
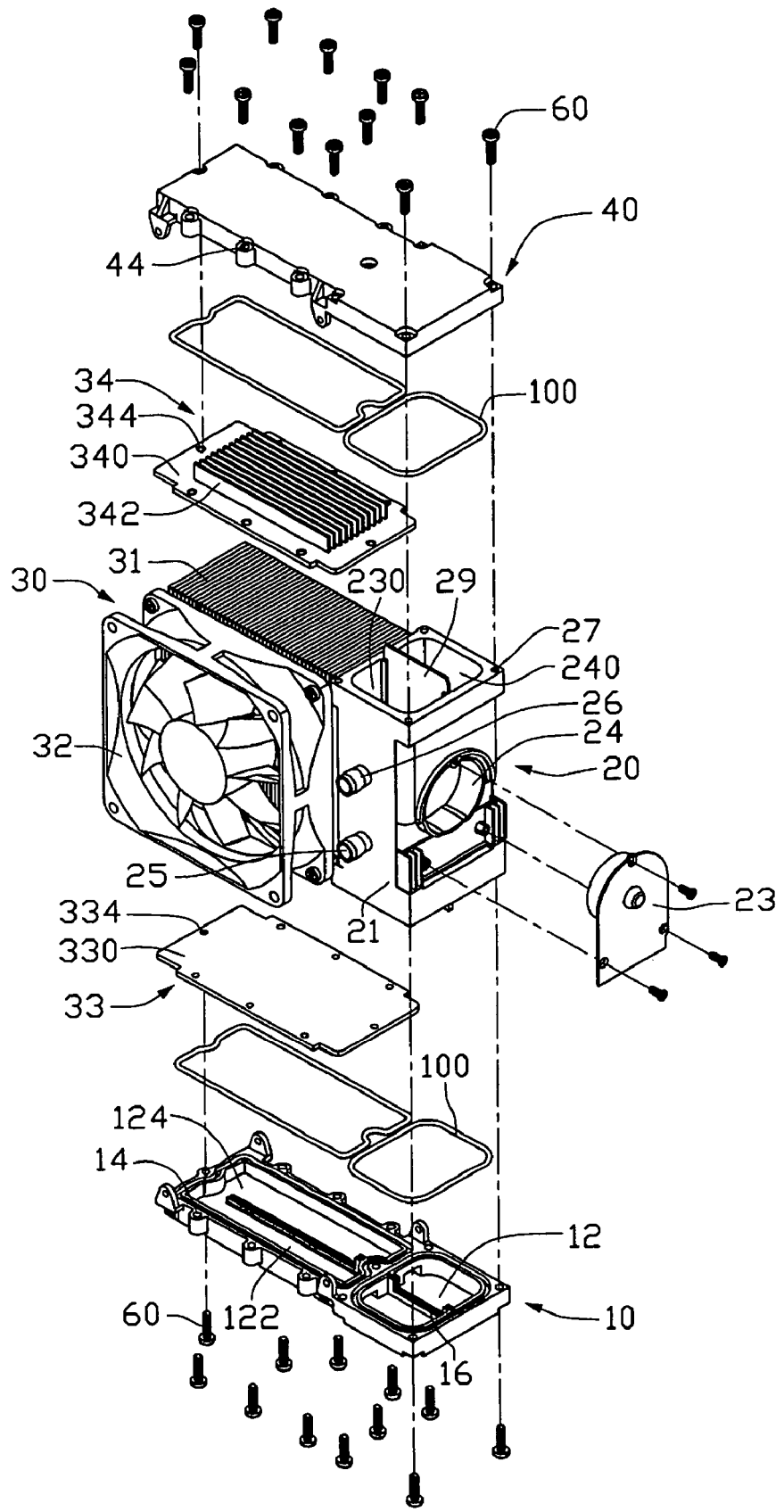
FIG. 2 is an exploded, isometric view of a heat-dissipating unit of the liquid cooling device of FIG. 1.
Figure 3:
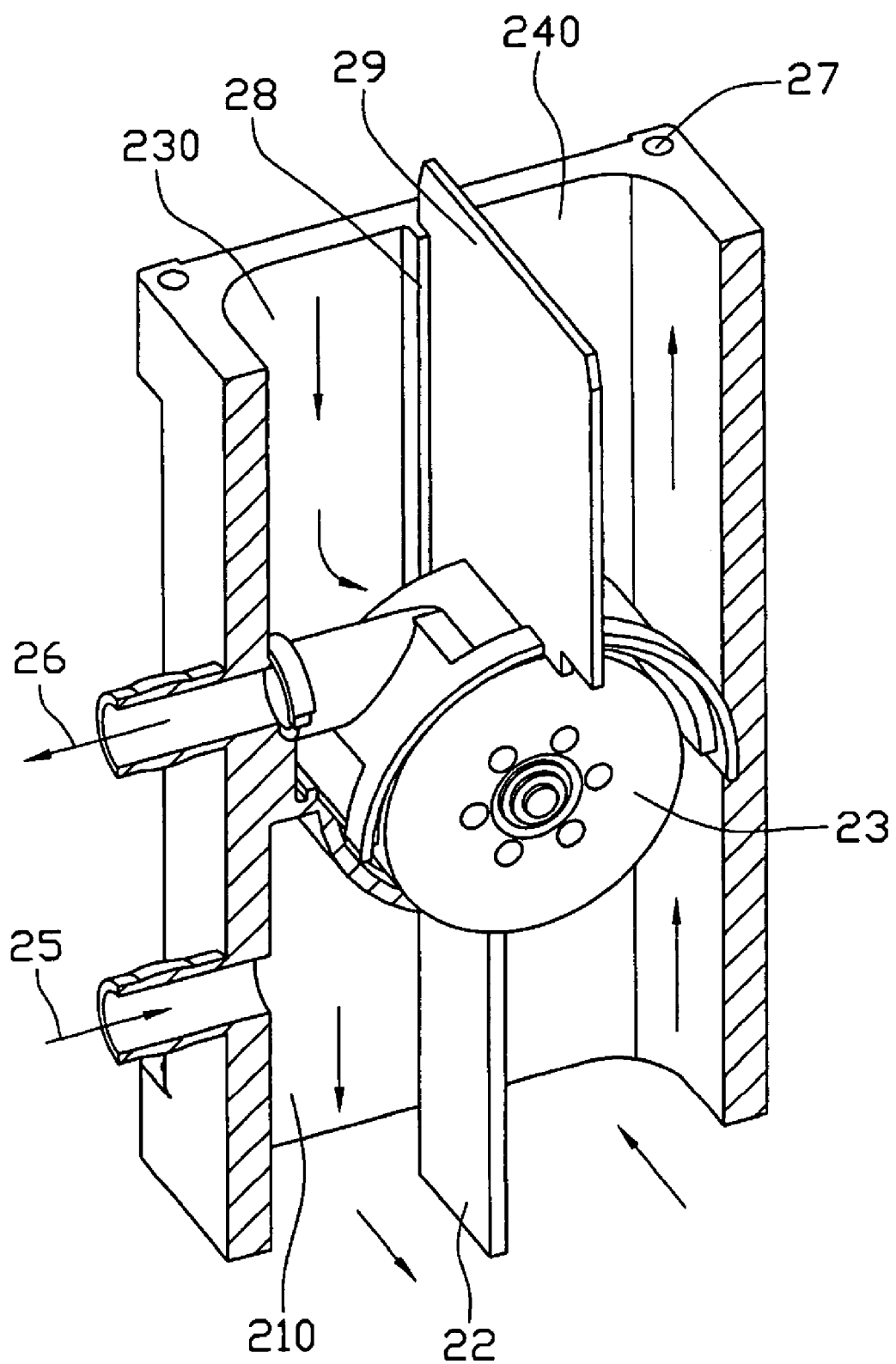
FIG. 3 is a partially sectional view of a tank of the heat-dissipating unit of FIG. 2.
Figure 4:
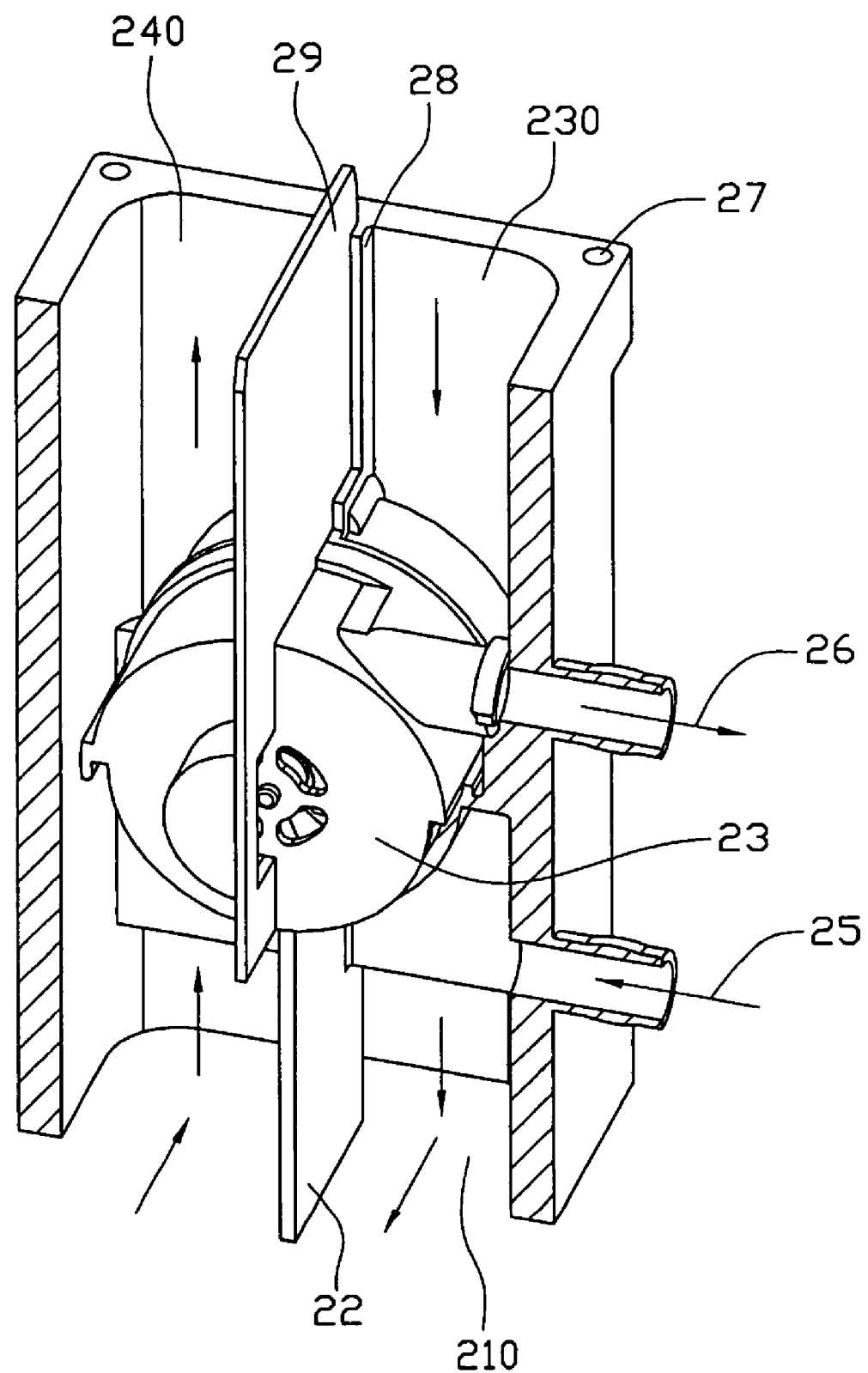
FIG. 4 is a view similar to FIG. 3, but taken from a different aspect.

Referring also to FIGS. 2 to 4, the heat-dissipating unit 1 comprises a base 10, a tank 20, a heat dissipating body 30 and a cover 40. The tank 20 is deposited on the base 10. Top and bottom of the tank 20 are respectively combined with a part of the base 10 and a part of the cover 40. The heat dissipating body 30 is located beside the tank 20 and sandwiched between the other part of the base 10 and the other part of the cover 40.

The base 10 defines a first groove 12 therein for the liquid coolant to flow therethrough, screw holes 14 around edges of sides of the base 10 and a socket 16 defined in a middle of the first groove 12. The socket 16 divides the first groove 12 into a first slot 122 and a second slot 124. The cover 40 has a structure similar to that of the base 10 and defines a second groove (not shown) and holes 44 therein. The tank 20 has top and bottom openings, and comprises two pairs of opposite sidewalls 21 extending from front, rear and two lateral sides of the base 10, and a liquid inlet 25 and a liquid outlet 26 in a middle of a front sidewall 21. The liquid inlet 25 and the liquid outlet 26 are respectively connected with the liquid inlet pipe 4 and the liquid outlet pipe 3. The tank 20 further defines a passage 24 through one lateral sidewall 21 of the tank 20 distant from the heat dissipating body 30 and four screw holes 27 respectively at four corners of the top and the bottom thereof for cooperating with the screws 60. The tank 20 comprises a pump 23, a lower clapboard 22 and an upper clapboard 29 in an inside thereof. A pair of ridges 28 is formed on an inside of the lateral sidewall 21 of the tank 20 for mounting of the clapboards 22, 29 inside of the tank 20. The pump 23 and the clapboards 22, 29 together divide an inner space of the tank 20 into three portions, namely a first channel 210, a second channel 230, and a third channel 240. The first channel 210 is communicated with the first groove 12 of the base 10. The second channel 230 is communicated with the second groove of the cover 40 and isolated from the first channel 210. The third channel 240 is isolated from the first and second channels 210, 230 and communicated with the first groove 12 and the second groove of the cover 40.

The heat dissipating body 30 comprises a plurality of spaced heat dissipating fins 31 defining an air flow passage (not labeled) therein, a fan 32 secured to a front of the heat dissipating fins 31 and bottom and top conduct plates 33, 34. The bottom and top conduct plates 33, 34 are respectively placed on bottom and top of the heat dissipating fins 31. The bottom conduct plate 33 comprises a board 330 and a plurality of cooling fins (not shown) extending downwardly from the board 330. The board 330 defines a plurality of screw holes 334 thereof respectively corresponding to the holes 14. The top conduct plate 34 comprises a board 340 and a plurality of cooling fins 342 extending upwardly from the board 340. The top conduct plate 34 further defines a plurality of screw holes 344 therein corresponding to the holes 44. Screws 60 are used to extend through the holes 14, 44 and screw into the screw holes 334, 344 and 27, to thereby combine the base 10, cover 40, bottom conduct plate 33, top conduct plate 34, tank 20 and heat dissipating body 30 together.

A part of the base 10 is combined with the bottom conduct plate 33, and the other part is connected with the bottom of the tank 20. Two lower sealing rings 100 are used so that the base 10 can be hermetically mounted to the bottoms of the heat dissipating body 30 and the tank 20. A part of the cover 40 is combined with the top heat conduct plate 34 and the other part is with the top of the tank 20. Two upper sealing rings 100 are used so that the cover 40 can be hermetically mounted to the tops of the heat dissipating body 30 and the tank 20.

In operation, the liquid coolant contained in the chamber 220 absorbs heat from the heat generating electronic component (not shown). Particularly referring to FIGS. 3-4, a movement of the liquid coolant is shown by arrows. The heated liquid coolant is pumped to flow into the first channel 210 via the liquid inlet pipe 4 and the liquid inlet 25. Then the liquid coolant flows in the first slot 122 of the first groove 12 to reach the second slot 124 thereof, during which the liquid coolant adequately contacts with the cooling fins of the bottom conduct plate 33 and transfers heat upwards to the heat dissipating fins 31. The liquid coolant leaves the base 10 and is pumped to flow in the cover 40 through the third channel 240. Thereafter the liquid coolant flows through the cooling fins 342 of the top conduct plate 34 and transfers the heat to the top conduct plate 34 and then the heat dissipating fins 31. After that, the liquid coolant leaves the cover 40 and returns to the chamber 220 of the heat-absorbing unit 2 through the second channel 230, the liquid outlet 26 and the liquid outlet pipe 3. From the chamber 220, the above-described circulation of the liquid coolant repeats again. During the operation, the fan 32 generates a forced air flow through the air flow passage of the fins 31 to increase the heat dissipating efficiency of the fins 31.

The tank 20, the pump 23, the heat dissipating body 30, the base 10, the cover 40, the top heat conduct plate 34 and the bottom heat conduct plate 33 are assembled together as a single unit prior to being attached to a computer system. The whole structure of the liquid cooling device is compacted; thus, it satisfies the trend that electronic equipments are becoming smaller and smaller. The liquid coolant flows in the base 10 and the cover 40 to sufficiently contact with the conduct plates 33, 34, so contacting surface between the conduct plates 33, 34 and the liquid coolant increases. The liquid coolant, which is heated by the heat generating electronic component, is completely cooled by transferring the heat to the conduct plates 33, 34 and then to the heat dissipating fins 31 when the liquid coolant flows through the base 10 and the cover 40. The liquid coolant has a sufficient heat exchange with the heat-dissipating body 30. The liquid cooling device in accordance with the present invention has improved cooling efficiency for heat generating electronic component and has a compact structure and is easy to be installed.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A liquid cooling device comprising:
   a heat-absorbing unit for thermally contacting with a heat generating electronic component;
   a heat-dissipating body defining an air flow passage therein, the heat-dissipating body comprising a plurality of spaced heat-dissipating fins and bottom and top conduct plates deposited on top and bottom of the spaced heat-dissipating fins;
   a fan mounted to the heat dissipating body for forming a forced air flow flowing through the air flow passage;
   a liquid coolant circulation loop comprising a base attached to a bottom of the heat-dissipating body and combining with the bottom conduct plate of the heat-dissipating body, a cover attached to a top of the heat-dissipating body and combining with the top conduct plate of the heat-dissipating body, and a tank beside the heat-dissipating body and communicating with the base and the cover, the base and the cover respectively define a first groove and a second groove, and bottom and top of the tank being respectively communicated with the first groove and the second groove of the base and the cover;
   a pair of pipes connecting the tank of the circulation loop to the heat-absorbing unit for liquid flowing between the circulation loop and the heat-absorbing unit; and
   a pump arranged in the loop to drive a circulation of liquid in the liquid cooling device from the heat-absorbing unit to the circulation loop and back to the heat-absorbing unit, wherein the heat dissipating body, the fan and the circulation loop are built as a single unit.

2. The liquid cooling device of claim 1, wherein an inner space of the tank is divided into a first channel communicated with the first groove of the base, a second channel communicated with the second groove of the cover and a third channel communicated with the first groove of the base and the second groove of the cover.

3. The liquid cooling device of claim 1, wherein the tank comprises a liquid inlet connecting one of the pipes, and a liquid outlet connecting the other of the pipes, the tank defining a passage at one side for insertion of the pump in the tank.

4. The liquid cooling device of claim 3, wherein the tank further comprises at least one clapboard, and the pump cooperating with the at least one clapboard to divide the inner space of the tank into the first channel, the second channel and the third channel.

5. A liquid cooling device comprising:
   a heat-absorbing unit;
   a heat-dissipating body;
   a base defining a first groove;
   a cover defining a second groove;
   a tank defining a first channel communicating with the first groove of the base, a second channel communicating with the second groove of the cover and isolated from the first channel, a third channel isolated from the first and second channels and communicating with the first groove and the second groove;
   a pair of pipes connecting the first channel and the second channel to the heat-absorbing unit; and
   a pump positioned in the tank to drive a circulation of liquid in the liquid cooling device from the heat-absorbing unit, the tank, the first groove, the second groove, the tank and back to the heat-absorbing unit.

6. The liquid cooling device of claim 5, wherein the heat-dissipating body and the tank are connected on the base and the heat-dissipating body is secured to a side of the tank.

7. The liquid cooling device of claim 6, wherein the cover connects with the heat-dissipating body and the tank at a position opposite to the base.

8. The liquid cooling device of claim 5, wherein the tank comprises two pair of opposite sidewalls, top and bottom openings and a passage through one of the sidewalls, the top opening communicating with the second groove, the bottom opening communicating with the first groove, the pump being inserted through the passage into the tank.

9. The liquid cooling device of claim 5, further comprising a fan mounted on one side of the heat-dissipating body.

10. The liquid cooling device of claim 5, wherein the heat-absorbing unit comprises a chamber therein for containing the liquid.

11. A liquid cooling device comprising:
  a heat-absorbing unit adapted for thermally contacting with a heat generating electronic component;
  liquid coolant; and
  a heat dissipating unit, comprising:
  a tank fluidically connecting with the heat absorbing unit;
  a heat-dissipating body secured to a side of the tank;
  a cover mounted to tops of the tank and the heat-dissipating body;
  a base mounted to bottoms of the tank and the heat-dissipating body; and
  a pump mounted in the tank, wherein when the pump operates, the liquid coolant flows in circulation according to a sequence: the heat absorbing unit, the tank, the base, the tank, the cover, the tank and finally back to the heat absorbing unit.

12. The liquid cooling device of claim 11, wherein the heat-dissipating body comprises a top conduct plate having heat-dissipating fins projecting into the cover, and a bottom conduct plate having heat-dissipating fins projecting into the base.

13. The liquid cooling device of claim 12, wherein the tank has a clapboard, the clapboard cooperating with the pump to divide an inside of the tank into first, second and third channels, the first channel communicating with an outlet of the heat-absorbing unit and the base, the second channel communicating with the base and the cover, and the third channel communicating with an inlet of the heat-absorbing unit and the cover.

14. The liquid cooling device of claim 13, where the heat-dissipating body comprises a fan for generating a forced air flow.

* * * * *